United States Patent [19]
Blonder et al.

[11] Patent Number: 5,149,404
[45] Date of Patent: Sep. 22, 1992

[54] FINE LINE SCRIBING OF CONDUCTIVE MATERIAL

[75] Inventors: Greg E Blonder, Summit; Theodore A. Fulton, Warren Township, Somerset County, both of N.J.

[73] Assignee: AT&T Bell Laboratories, Murray Hill, N.J.

[21] Appl. No.: 628,253

[22] Filed: Dec. 14, 1990

[51] Int. Cl.⁵ .......................... C25F 3/12; C25F 3/14; B44C 1/22
[52] U.S. Cl. .............................. 204/129.1; 204/129.3; 156/643
[58] Field of Search ............. 219/121.39, 129.4, 69.15, 219/69.1, 69.11, 69.17; 204/129.35, 129.55, 224 M, 129.3, 299 R, 414, 129.95; 156/643

[56] References Cited

U.S. PATENT DOCUMENTS

| | | | |
|---|---|---|---|
| 3,436,516 | 4/1969 | Swift | 219/121.38 |
| 4,283,259 | 8/1981 | Melcher | 204/129.3 |
| 4,306,951 | 12/1981 | Depp et al. | 204/129.3 |
| 4,330,788 | 5/1982 | Hinz et al. | 204/299 R X |
| 4,425,496 | 1/1984 | Le Fur et al. | 219/69.17 X |
| 4,634,826 | 1/1987 | Solomon et al. | 204/224 M X |
| 4,931,613 | 6/1990 | Salsgiver et al. | 219/68 |

OTHER PUBLICATIONS

G. Albrecht-Buehler, "The Angular Distribution of Directional Changes of Guided 3T3 Cells," *J. Cell Biology*, vol. 80, pp. 53–60 (1979).

A. C. Hardy, et al *The Principles of Optics*, p. 563, McGraw-Hill (1932).

Japanese Patent App. 982-33922, Filed Feb. 24, 1982, Sato et al.

J. P. Ibe, et al, *J. of Vacuum Science and Technology A*, 4, p. 3510 (1990).

A. L. Livshits, *Electro-Erosion Machining of Metals*, p. 1, Butterworths, London (1960).

*Primary Examiner*—Donald R. Valentine
*Attorney, Agent, or Firm*—B. S. Schneider

[57] ABSTRACT

Fine lines (approximately 3 microns or less) are patternable on conductive materials by electromachining techniques. These micro-techniques differ from conventional electromachining in that the linewidth is primarily determined by the characteristics of the electric field rather than the electrode geometry.

17 Claims, 2 Drawing Sheets

FINE LINE SCRIBING OF CONDUCTIVE MATERIAL

BACKGROUND OF THE INVENTION

1. Technical Field

This invention relates to pattern delineation and, in particular, to pattern delineation involving electric discharges.

2. Art Background

Many different applications require that fine lines be delineated ("traced") on substrate materials. Three typical examples of such applications are VLSI reticle mask fabrication, hybrid circuit fabrication and construction of diffraction gratings. Although the need for fine line tracing has spawned several successful technologies, new and improved tracing technologies are still sought in the art. Two of the more successful tracing technologies are lithography and mechanical scribing.

Exemplary of articles produced by lithography are reticle masks. A metal (usually chromium) plated glass substrate is coated with a radiation-sensitive resist. The resist is then exposed using a well-collimated electron beam or laser. This exposure process serves to trace predetermined patterns in the resist, inducing localized chemical reactions in the exposed pattern. The resist is then developed in a suitable solvent leaving regions of bare metal corresponding to the laser (or electron beam) pattern. The remaining metal is covered with resist. The unprotected, bare metal is subsequently etched through to the transparent substrate leaving behind a pattern of resist-coated metal corresponding to the laser or electron beam pattern. The resist is then removed and a reticle mask composed of transparent substrate regions and opaque metallized regions remains. The reticle mask is then employed as an optical master in subsequent lithographic steps for integrated circuit fabrication.

The conventional lithographic process for fabrication of reticle masks yields excellent fine linewidths (well under 1 micron with electron beam technology; 3 microns with laser technology), but has a very high capital cost due to the complicated electron beam or laser apparatus required to trace the pattern. A resistless direct thermochemical laser etching process that may also be suitable for tracing has been developed (see U.S. Pat. No. 4,283,259, issued Aug. 11, 1981). However, this laser technique also suffers from the high capital requirements of the conventional lithographic systems.

The formation of fine lines in hybrid and printed circuits is also generally accomplished by conventional lithographic techniques. However, lithography is hard-pressed to cope with some of the extremely nonplanar features frequently found in hybrid circuits. The optical system that projects the mask image on the resist cannot keep the entire nonplanar hybrid structure in its focal plane. Furthermore, the resist at the nonplanar steps is subject to self-masking from the vertical mask image rays. Thus, for some applications, not only high capital requirements but also technical limitations are associated with lithography.

In contrast to the relatively expensive fine-line lithographic technology developed for integrated circuit fabrication, mechanical scribing technology has far lower capital and operating costs. Unfortunately, it is generally far less capable of scribing fine lines. One typical apparatus yields 20 micron resolution specifically for evaporated gold surfaces. (See, for example, Albrecht-Buehler, *J. Cell Bio.*, 80:53 (1979).) Highly sophisticated scribing technologies have been embodied in dividing engines. Mechanical dividing engines have scribed gratings of up to 100,000 lines/inch resolution (0.25 micron linewidth). See Hardy and Perrin, *The Principles of Optics*, p. 563, McGraw-Hill (1932). However, these dividing engines are expensive and inflexible, designed only to trace parallel grooves generally only in soft substrate materials.

Mechanical scribing, like most machining techniques, uses one piece of solid material to shape another. Materials can also be shaped by "electromachining" processes such as electric discharge machining (EDM), also known as electrospark or electro-erosion machining. This technique, which potentially works on all electric conductors, relies on pulse plasma vaporization of the material being worked. The workpiece is grounded and an arc is struck between an electrode and the piece. If the piece is a sufficiently good conductor, the arc forms a plasma which vaporizes material in the close proximity of the arc. If conditions are chosen so that the plasma is extinguished shortly after the arc is struck, reasonable control over the removal process can be obtained. This technique is useful, for example, to bore, grind, and slot metal. Another electromachining process is called electrochemical machining (ECM). This process is similar to EDM except it uses electro-etching rather than plasma discharge to remove material from a workpiece.

Both ECM and EDM have significant limitations. The conventional wisdom in EDM holds that the working electrode must have the inverse shape and correct dimensions of the form to be generated during machining. The simplest and strongest branding iron is a cylinder, and indeed 10 micron holes have been pierced in material using the EDM process with fine-drawn wire electrodes (Japanese Patent Application 982-33922, filed Feb. 24, 1982 (Sato et al)). However, a more complicated micro-branding iron would be very difficult to fabricate and probably would not have enough mechanical integrity to successfully delineate surfaces. As mentioned, translation of a 10 micron cylindrical wire in the fashion of a mill to produce a delineated pattern rather than a hole presents extraordinary mechanical integrity problems.

In summary, the need for drawing fine lines has only been satisfied by expensive lithographic or laser technologies. Mechanical scribing does not yield the 10 micron lines required for reticle mask technology in a flexible or inexpensive manner. With the exception of EDM microdrilling, existing electromachining techniques do not appear appropriate for any small-scale work and the sole ability to drill holes is of limited use. Although inexpensive alternatives to lithography have been sought, they have not been found.

SUMMARY OF THE INVENTION

The invention involves a direct low-cost electromechanical means for scribing ultrafine lines (as narrow as 1-3 microns) on conducting materials. These attributes are achieved by adjusting conditions so that the electric field applied to the scribing electrode, rather than the size of the scribing electrode, determines the spatial resolution. Thus, by violating accepted practice in electromachining techniques, i.e., by employing electrical conditions rather than electrode geometry to determine spatial resolution, excellent results are obtained.

Intimate contact between the electrode and workpiece is not required; merely proximity sufficient to concentrate the electric lines of force. Although this technique is most useful for scribing very fine lines, wider lines are not precluded.

In typical applications, a sharpened electrode is held in close proximity to, or contacting, the workpiece to be scribed. The electrode is connected to one of the terminals of an electric power supply, the workpiece to the other. Upon energizing the power supply, the electrode and piece are translated with respect to each other by an appropriate means. Energy from the electric power supply scribes the line by a variety of physical processes depending on the electrical and other environmental conditions used. These processes include electroetching and pulse plasma vaporization.

DETAILED DESCRIPTION

The invention involves a new method for direct scribing on conducting materials. The scribing is carried out by the translation of a scribing means (generally a microelectrode) which removes the conducting material directly adjacent to it by various physical processes mediated by an electric field. The exact nature of these physical processes depends on the operating conditions chosen. The inventive technique achieves linewidth resolution comparable to that obtained by the laser tracing step in conventional lithography, at comparable writing speeds, with far lower capital cost and with greater setup flexibility.

Figure 1:
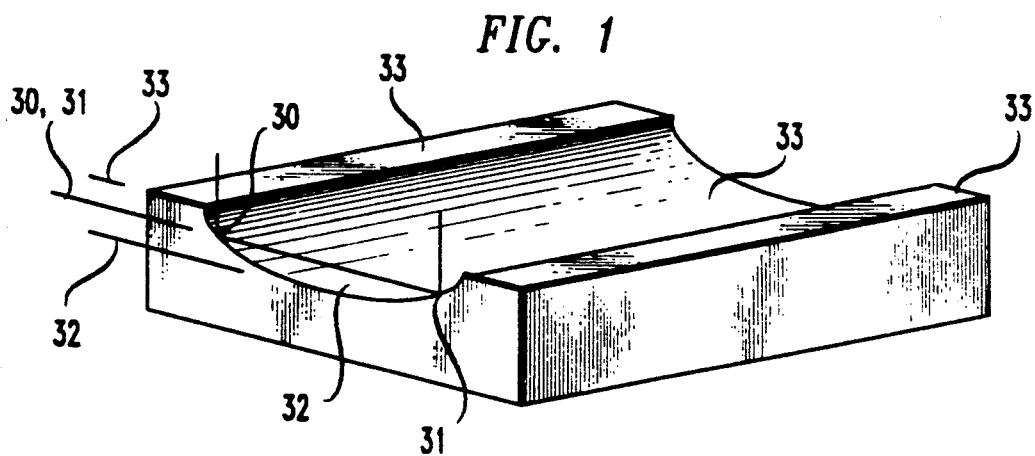
FIGS. 1 and 2 illustrate concepts employed to define the invention.

The invention requires that the field intensity between the electrode tip and workpiece determines the spatial resolution, rather than the geometry of the electrode itself. This implies that the diameter of the tip employed should be less than the spatial resolution contemplated. In the context of this invention, spatial resolution is the root-mean-square (RMS) width of a line having a length at least 10 times its width drawn under the specified set of conditions. Width (or linewidth) is measured on a cross-section of the scribed feature (see FIG. 1), between points 30 and 31; these points are defined as the points on both the scribed feature and the mean plane representing the surface 33. For a curved feature, this plane is defined as the means of tangents to the scribed surface, a tangent being established for each region the approximate size of the linewidth by the average of the tangents in that region, and such region tangents being the average of tangents over a region averaging out areas smaller than the linewidth.

Figure 2:
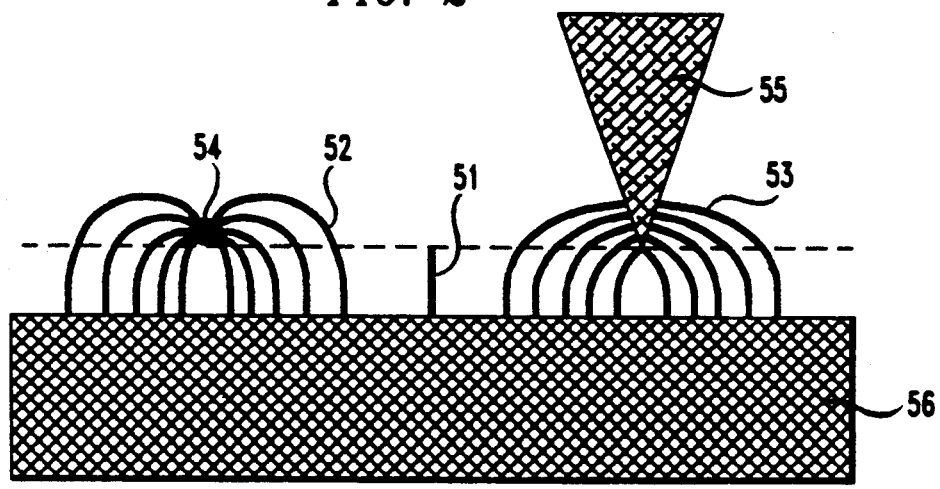

Since the tip need not be spherical or hemispherical in shape, it is important to define the tip diameter. This diameter is defined as twice an electrically-defined radius of a particular imaginary sphere. This imaginary sphere 54 is assumed to be kept at the potential of the electrode tip 55. The radius of this imaginary sphere is the one that creates the field distribution 52 that best approximates the actual field distribution 53 caused by the tip as measured at the workpiece 56 (both tips and the workpiece are assumed to be infinitely conductive), given the following constraints (See FIG. 2):

1. The radius of curvature of the workpiece at the point of measurement is over ten times greater than the tip radius (a flat workpiece is preferred from the point of view of this definition, although a flat workpiece certainly need not be used in the invention), and 2. The distance of closest approach, 51, between the electrode and workpiece is the same as that between the workpiece and the imaginary sphere.

Although the size of this imaginary sphere may vary somewhat with workpiece curvature, electrode distance, etc., these variations are insignificant within the limits of the invention. (Unless specifically otherwise stated, all subsequent references to the tip region or tip radius or diameter will assume these electrical definitions.)

Since the curvature at the tip is generally much higher than the curvature of the workpiece, the shape of the lines of electric force usually are determined almost solely by the tip size and tip distance from the workpiece, and cover a greater area at the workpiece than at the tip. The scribing process acts on the area at the workpiece covered by the lines of electric force. For nonlinear embodiments (e.g., pulse plasma vaporization), the area acted upon is clearly dependent on the electric field intensity. For embodiments whose effects are linear in field strength (e.g., electro-etching, under idealized conditions), the entire area of the workpiece is acted upon by the field. Nevertheless, the field intensity still controls spatial resolution, as the more remote portions of the workpiece are only affected slowly by the weak, distant electric field.

A scribing electrode with a tip diameter smaller than the linewidth contemplated is held at controlled electric conditions with reference to a conductive workpiece. In some embodiments, the entire workpiece is conductive; in other embodiments, merely the surface of the workpiece is conductive. The scribing electrode-workpiece distance is kept sufficiently small so that the electric lines of force between the electrode and the workpiece are concentrated over an area of the workpiece comparable to the width of the line to be scribed. (The scribing electrode-workpiece distance is not otherwise significant, and is generally maintained by conventional means such as simple pressure on a mechanically tough scribing electrode.) The electric conditions (field intensity, current, or other parameters to be described below) are then chosen so that these conditions, rather than the electrode geometry, determine the spatial resolution of the scribing process. As a result, the linewidth is appreciably larger than the diameter of the electrode. This does not mean the shape of the electrode tip cannot influence the shape of the scribed line. For example, an appropriately shaped tip will scribe a line with a nonuniform cross-section. However, this hypothetical cross-section in the practice of the invention is not complimentary in shape to the tip of the scribing electrode, but rather is determined by the field engendered by the electrode as it propagates through the intermediate medium to the surface of the workpiece. The electrical conditions should generally be chosen so that the linewidth is at least 1.25 times the diameter of the scribing electrode.

The concentration of electric force ensures that it is possible to confine the scribing process to a small area. (Obviously, by choosing sufficiently large electrodes or field strengths, this scribing process is also suitable for very large areas as well. Although such large-area scribing is also comprehended by the instant invention, technological needs seem centered on small-area scribing).

Means are selected so that the concentrated electric force scribes the surface when the scribing electrode is translated. Exemplary of such means are pulse plasma vaporization or electro-etching, either of bulk conducting materials or of thin conducting films laid over an insulator.

Pulse Plasma Vaporization Embodiment

Figure 3:
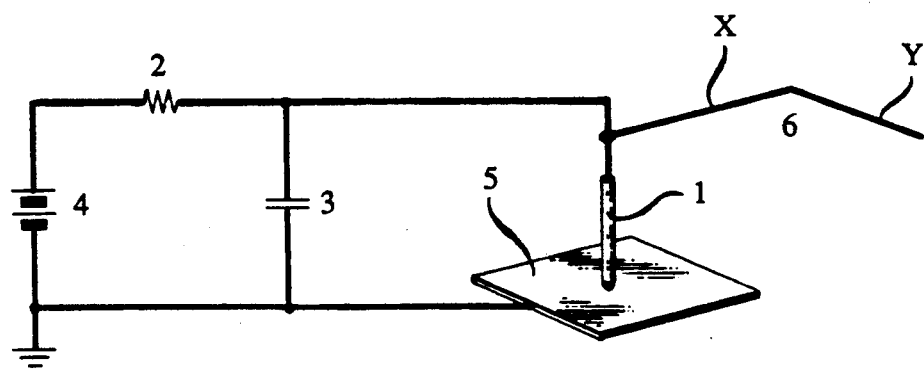
FIGS. 3 through 5 are illustrative of different embodiments of the invention.

An apparatus embodying pulse plasma vaporization conditions is shown in FIG. 3. The scribing electrode 1 is electrically connected to an RC network 2,3, which is in turn connected to a pole of an electric power supply 4. The workpiece 5 is connected to the other pole of the power supply. The scribing electrode is mechanically connected to a translation means 6. Alternatively, the workpiece is connected to the translation means, with the scribing electrode fixed.

The scribing electrode is made out of any tough conductive refractory material such as tantalum or tungsten. The tip of the electrode is formed to a fine point (see J. P. Ibe, et al., *Journal of Vacuum Science and Technology* A, 4, 3510 (1990).) A tip radius of approximately 1 to 3 $\mu$m is generally adequate, but any appropriate tip radius, as defined above, performs adequately. The electrode is attached by suitable means to a holding device and the appropriate pole of a power supply. The electrode, either bare or insulated on its sidewalls, is placed in contact or near-contact with the workpiece by either gravity or other force such as that provided by a system of springs. Direct electrode-workpiece contact is generally only desirable for workpiece materials, such as chromium, that have a thick oxide coat and do not easily scratch. For such materials, contact forces may be as high as 100 g, although forces closer to approximately 1 g. are sufficient to keep the electrode from skipping as it is translated with reference to the workpiece. Materials lacking an insulating surface coat typically require means to place the electrode in close proximity to the workpiece without direct contact.

The contact force, supply voltage, and series resistance are chosen to provide discontinuous sparking as the electrode is translated over the workpiece surface. This requirement of discontinuous sparking is generic to all pulse plasma vaporization processes including conventional EDM on a macro scale since an uninterrupted energy supply typically leads to degradation of cutting accuracy, melting of layers, and poor surface finish (Livshits, *Electro-Erosion Machining of Metals*, p. 1, Butterworths, London, 1960). To form a plasma discharge, the conductive path should arc through the dielectric medium (e.g., air, an oxide layer, or some other dielectric) connecting the electrode and workpiece. Too short an electrode-workpiece distance or too high a contact force will short this dielectric medium and permit a direct conductive path between the electrode and workpiece. In this case, a plasma is not established. Too low a series resistance or too high a power supply voltage will keep the plasma from rapidly extinguishing, perhaps establishing a direct conductive path without plasma formation, or alternatively causing uncontrolled cutting.

Provided that the sparking is discontinuous, the amount of material removed is approximately proportional to the energy in each pulse. The pulse energy is determined primarily by the power supply voltage and shunt capacitance. These values vary considerably depending on the resistivity and melting point of the material to be sparked. Voltages range from approximately 2 V to greater than 1000 V in some applications (e.g., sparking of high-resistivity silicon). Capacitances range from 10 pF to 10 $\mu$F, and resistance from 10 to 10,000 $\Omega$'s. The pulse energy determines the linewidth of the cut, provided that the electrode size is appropriately chosen, and the RC time determines how fast the capacitor charges between pulses, with the combination of RC time and pulse energy limiting the transition speed. In cases of conductive solids, each pulse vaporizes a roughly equivalent amount of material in all three dimensions, and the depth of cut is similar to the linewidth. In cases where only the surface of the workpiece conducts (such as a thin film laid over an insulator, or a semiconductor layer laid over an semi-insulating layer), the depth of cut is approximately limited to the conducting surface's depth, and the width of the cut is determined by the pulse energy. Bulk and surface conducting workpieces will be discussed in greater detail below.

The embodiment discussed is but one of many possible techniques. For example, it is possible to generate pulses by a square-wave generator, and the operating conditions of the apparatus change accordingly. The key requirements are a scribing electrode of diameter smaller than the workpiece feature size, a means that provides discontinuous electrical pulses under scribing conditions, and some means to keep the scribing electrode from establishing a low-resistance direct contact with the workpiece.

The translation rate should be sufficiently low to yield continuous cutting. In general, speeds under 10 cm/sec are slow enough, especially when series resistances (2 in FIG. 3) under 100 ohms are selected. To be continuous, the electrode should spark at least once for each diameter of the material pit removed by a single plasma pulse. Evidence of discontinuous cutting ranges from scalloped cutting sidewalls to frank discontinuities in the cutting path.

Electro-etching Embodiment

This particular embodiment, also has the distinct features of the invention, i.e., inscribing fine lines by means of translation between a scribing electrode and the workpiece, with linewidths controlled not by the geometrical properties of the scribing electrode, but rather by the electrical and environmental characteristics of the system. Electro-etching is different from pulse plasma vaporization in the means by which the electric field acts on the workpiece. Electro-etching is an electrochemical process in which a workpiece serves as a positively charged anode and an electrode as a negatively charged cathode. The workpiece is locally oxidized by the action of the electric field lines. The oxidized material, soluble in the electrolyte solution connecting the anode and cathode, dissolves into the solution leaving a scribed volume behind. Although not all materials are suitable for electro-etching, a large and well-known class of materials, e.g., chromium, copper and nickel, being readily oxidizable by an electric potential and having an oxidation product that can be removed from the substrate preferably by dissolution into the electrolyte bath, satisfies the conditions mentioned herein. It is also useful, although not essential, that the dissolved ions do not plate onto the cathode electrode.

Electro-etching of fine lines for pedagogic reasons will be discussed in terms of situations in which a conducting film is deposited over an insulating substrate.

Such situations occur in a photomask in which a metallic (usually chromium) film is laid over a dielectric substrate. However, the invention is not limited to this example which is only illustrative. Electro-etching of fine lines is also suitable when practiced on bulk conductors or other conducting surfaces overlaid on insulators. Fine electroplating is also possible. It is possible to use the plated material (e.g., Sn on Cu) in a subsequent wet chemical etch to define the required pattern.

Figure 4:
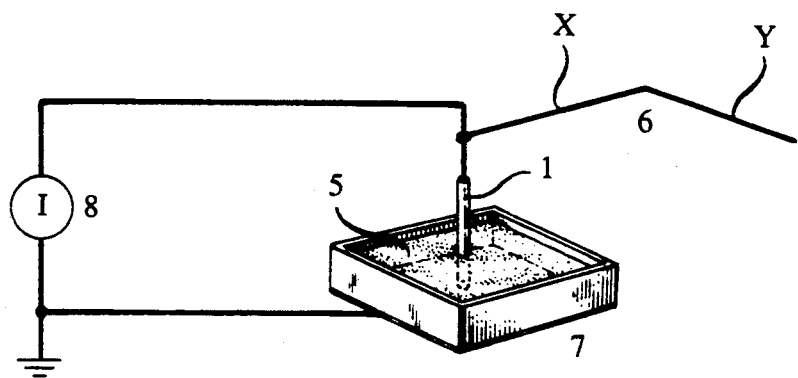

The apparatus (see FIG. 4) for electro-etching is similar to that for pulse plasma vaporization. However, the electro-etching process is continuous and does not need the pulse-shaping resistor and capacitor of FIG. 3. The power supply 8 is of the constant-current type in preferred embodiments. It should be capable of providing current in the 0.1 microamp to 100 ma region, especially if small scribing electrodes are used. (Larger scribing electrodes or linewidths, or extremely high translation speeds (greater than 10 cm/sec) generally require more current.) The scribing electrode 1 is similar to that described for pulse plasma vaporization with the added constraint that it is composed of an electrochemically inert material on which the electrolytically etched material does not readily plate. In preferred embodiments, the electrode is insulated on its sidewalls and only conducts at the tip. Again, tungsten or tantalum is adequate material. The conducting bath 7 serves as a supporting electrolyte for the etching process. The bath also serves other functions related to the system such as complexation of metal ions released from the surface by the etching process, or buffering decomposition products formed at the cathode.

When the scribing electrode is translated parallel to the film, the film tends to etch in a line. If the system parameters (current, film-cathode distance, film thickness and translation speed) are properly set and constant, the etched line is a constant width and extends to the bottom of the film. The slower the translation speed or the higher the current, the thicker the etched line is in accordance with Faraday's law. A feedback means of conventional design is useful for interrelating these two (or other) parameters and obtaining a more thorough control over the linewidth.

Figure 5:
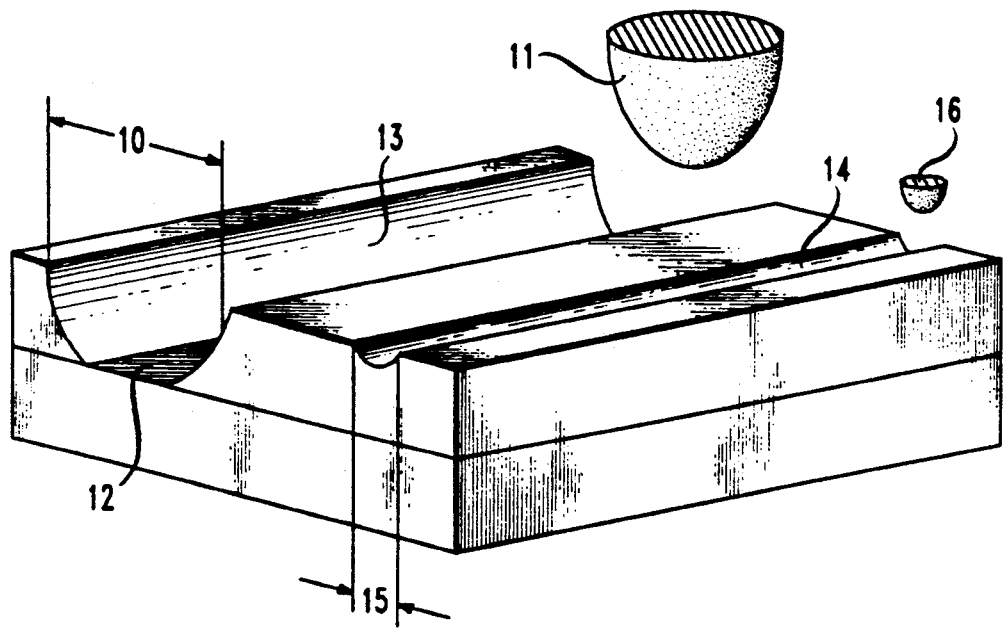

An arbitrarily large linewidth is thus obtained with sufficiently high currents and low translation speeds. In some variants of the surface embodiment described herein, some characteristics of the etched feature are actually smaller than the tip diameter of the scribing electrode. In FIG. 5, the scribed feature 13 has a width measured at the nonconducting layer 12 that is smaller than the linewidth 10 as defined in FIG. 1. As stated above, the etching process should proceed with a linewidth 10 larger than the scribing tip 11 diameter. Since the linewidth scribed 10 is not defined as the length of the chord 12, this particular variant does not violate the terms of the invention.

One advantage of this particular embodiment is the wide range of linewidths available by simply controlling current or translation speed. One common problem of conventional lithography is tracing large areas; the narrow tracing beam consumes substantial time in rastering these areas. This rastering is less necessary with film electroetching; it is possible to etch large areas quickly by simply raising the current and thus increasing the linewidth. Another advantage of this embodiment over pulse plasma vaporization is that it is possible to blaze or texture the etched line by using appropriately-shaped electrodes or fields. However, different embodiments of the invention are advantageous in different specific situations. Electroetching is not superior to pulse plasma vaporization in all circumstances. For example, pulse plasma vaporization works on a much wider variety of materials not being limited by electrochemically appropriate materials as with electroetching.

Typical system parameters for obtaining a 10 micron linewidth on a 100 nm chromium-plated glass disk are a current of approximately 0.2 to 2 ma, at translation speed of approximately 10 mm/sec, an electrode force of about 0.1 to 1 g., and electrolytes such as 10% (w/w) citric acid in water.

Surface and Bulk Embodiments

The two embodiments so far described have been different in the electric means used to implement the invention. Different geometrical embodiments of the invention also are available. The electrical embodiments were described in a surface geometry with a thin film of conducting material laid over a thick insulating substrate. They are also useful in a bulk geometry with the entire workpiece being conductive. Although these geometrical embodiments are both described by the same basic invention, there are some significant differences between them.

The material scribed in the bulk embodiments are not preferably used while electrically uniform. In the bulk embodiments, the material scribed should merely be thicker than the scribed line is deep so that the depth of the scribed line is determined by electrical conditions rather than the material thickness itself. As FIG. 5 demonstrates, it is possible to scribe the same material in both bulk 13 and surface 14 embodiments, depending on the width (and corresponding depth) of the scribed cut chosen.

The requirements for the surface embodiments are considerably more complicated and are best viewed functionally. In the surface embodiments, the surface should be far more readily removable by the electric field than the underlying bulk layer. This condition imposes different physical restraints on different embodiments of the invention. In the electro-etching embodiment, this condition is met simply by a sufficiently large difference in the resistivity of the surface and substrate materials. A hundredfold difference in resistivity between the two layers generally suffices. However, other physical differences also serve to differentiate the two layers such as a p-n junction. Regardless of the physical difference employed to differentiate the film from the substrate, all differences should serve to provide an etch rate for the film significantly higher than the substrate.

The same basic condition applies for the pulse plasma vaporization technique, although the means used to apply this condition differ. In this case, the plasma should act significantly more slowly on the underlying substrate than on the film. A factor of ten in plasma removal rate is generally adequate for most purposes. This condition generally implies that the underlying substrate is a refractory material (or at least as high-melting as the film) or is of lower thermal impedance. It is preferred that the substrate be an insulator, but a conductive substrate is useful in some circumstances, such as a thin film of low-melting metal laid over a refractory metallic substrate.

The surface embodiments are easier to control using either pulse plasma vaporization or electro-etching techniques. Both techniques tend to be isotropic, removing material at approximately the same rate both axially and radially with respect to the scribing electrode. In bulk embodiments, a fixed scribing electrode tends to give a hemisphere of eroded material and in surface embodiments, a truncated hemisphere limited by the thickness of the conducting layer. Relative movement between the electrode and workpiece translates the hemispheres, scribing a semicircular channel in bulk embodiments but a more square-walled channel in surface embodiments.

When the pulse plasma vaporization technique is employed, a significant difference between the bulk and surface geometries emerges. With sufficiently thin surface films (or sufficiently high pulse energies) and an insulating substrate, the surface geometry is electrically self-limiting. The pulse vaporizes all of the adjacent conductive material leaving no electrical path to ground. Therefore, if the electrode is held fixed in this geometry, there is no danger of removing unwanted material. In the other physical and geometrical embodiments discussed, an electrically active but mechanically fixed electrode tends to continue to remove material, perhaps in an undesirable fashion. Feedback means are therefore advantageous in these other embodiments if the scribing electrode velocity is not to be constant. In a variation on the surface embodiment theme, it is possible to use this invention in cases where a thin surface insulator overlies a conductor. The chromium film examples discussed above are exemplary of this variation with their thin insulating oxide coats. A resist layer coated over a conducting silicon surface is also exemplary. This surface insulating coat, if employed, should preferably be thinner than the contemplated linewidth.

EXAMPLE 1

Pulse Plasma Vaporization—Surface Embodiment

A Hewlett-Packard #7225B X-Y plotter connected to a tungsten tip was used as a translation means. The tip was a tungsten wire 0.005 inches in radius electrolytically sharpened to a point of approximately 3 micron radius. The tip was about 1 cm long and attached to the plotter by clamps. The plotter was controlled with a Hewlett-Packard 9836 computer. The workpiece was a 4" diameter glass plate coated with approximately 100 nm of evaporated chromium metal. This workpiece was laid flat on the bed of the plotter. The electrical circuit of FIG. 3 was used with a Hewlett-Packard #617 operated in constant-voltage mode used as the power supply. The electrode force was about 10 g, the series resistance between 100 and 1000 ohms, the parallel capacitance between 0.1 and 0.5 ufarads, the voltage between 10–20 volts. The workpiece was connected to the power supply by a copper strap attached with spring clips. The translation speed was on the order of 0.1 to 1 mm/sec. Under these conditions the scribed linewidth was approximately 10 μm. When the voltage was raised above about 30 V the linewidth increased to approximately 15 μm. When the translation speed was increased above about 1 mm/sec, the traced line became discontinuous.

EXAMPLE 2

Electro-Etching—Surface Embodiment

The same conditions were used as in Example 1, except the power supply was used in constant-current mode and the resistor and capacitor were removed from the circuit. A clay dam was used to ring the glass plate so that the 10% (w/v) citric acid solution used as electrolyte would not spill on the X-Y plotter. The electrode force was approximately 10 g, the current about 0.1 ma, and the translation speed in the range 0.1–1 mm/sec. Under these conditions, a linewidth of about 10 microns was obtained. This linewidth was proportional to the current and inversely proportional to the translation speed. If the translation speed was reduced to zero, circles were etched from the chromium plate.

EXAMPLE 3

Pulse Plasma Vaporization—Bulk Embodiment

A silicon workpiece (resistivity of about 0.1 Ω-cm) was used. The workpiece was placed in an oil bath which was used as the dielectric medium and prevented the silicon surface from oxidizing. This oil bath was placed on a pedestal connected to a HP 7225B X-Y plotter. The oil bath and workpiece was thus moved while the electrode was spatially fixed. In this example, the electrode was not forced on the surface, but rather held a constant distance (about 20 microns) away from the surface. The electrode underwent vertical oscillations of amplitude of about 20 microns at approximately 2 kHz, to ensure that the sparking was discontinuous. These oscillations were driven by a piezoelectric transducer. The electric power supply and RC network of Example 1 were used with the addition of an electromechanical feedback circuit, which monitored the charge per pulse and the contact resistance between the workpiece and the electrode and controls the electrode X-Y position and distance from the workpiece.

In operation, the electrode having an applied 200 volts was brought down vertically until the feedback means had indicated a pulse discharge. The electrode was then pulled back, the translation stage proceeded an appropriate distance, and the electrode was lowered again, starting a new cycle. If the feedback circuit detected too low a resistance (an infrequent event caused by spot-welding of the electrode to the workpiece), it sent a signal causing the electrode to temporarily disengage from the workpiece breaking the spot weld.

EXAMPLE 4

Pulse Plasma Vaporization—Surface Embodiment on a Soft Semiconductor

A 100 ohm/square film of indium tin oxide coated over 5 mil mylar was the workpiece. The physical conditions were identical to those of Example 1, except 30 volts were used at the electrode tip to accommodate the higher resistivity of the indium tin oxide with respect to the chromium film of Example 1. The power was turned on before the electrode was allowed to contact the workpiece. This expedient ensured that a direct short to the workpiece did not occur. A plasma was formed as the workpiece came close to the electrode tip which vaporized the material below it, and thus permitted the self-limiting action characteristic of the pulse plasma vaporization embodiment on surfaces. This precaution was unnecessary with the chrome film which was protected from electrical shorting by its thin oxide coating. Electrical contact to the film was made with a large, plate electrode so plasma vaporization occurred only at the tip.

EXAMPLE 5

Photoresist on Silicon

A 1.5 micron thick layer of AZ1350J resist was applied to a silicon wafer. The pulse plasma vaporization conditions were identical to those used in Example 1. After the pulse plasma vaporization step was completed, the mask was suitable for subsequent deep chemical etching. The line drawn was about 5 $\mu$m wide, and had completely vaporized the resist and vaporized about 1 $\mu$m of the underlying silicon.

We claim:

1. A process for fabricating a body including a pattern delineated in a material of said body comprising the steps of delineating said material and completing said body characterized in that said delineation step comprises removing a portion of said material of said body through the use of an electric field emanating from an electrode tip to said material wherein said electric field controls said delineation, whereby the spatial resolution of said delineation is determined by the shape of said electric field, rather than by the shape of said electrode, and wherein this spatial resolution is such that the linewidth of said pattern is at least 1.25 times the diameter of said electrode tip and the geometry of said pattern is determined by translation of said electrode relative to the surface of said material.

2. The process of claim 1 wherein said lines of electric force act on said body by a process comprising electrolytic etching.

3. The process of claim 2 wherein said delineation step is performed with shaped electrodes.

4. The process of claim 1 wherein said lines of electric force act on said body by a process comprising pulse plasma vaporization.

5. The process of claim 1 wherein said body is an electrical conductor throughout its bulk.

6. The process of claim 5 wherein said lines of electric force act on said body by said process of electrolytic etching.

7. The process of claim 5 wherein said lines of electric force act on said body by the process of pulse plasma vaporization.

8. The process of claim 1 wherein said body comprises a conductive film laid over an insulating substrate.

9. The process of claim 8 wherein said body comprises a chromium film laid over said insulating substrate.

10. The process of claim 8 wherein said insulating substrate comprises an optically transparent medium such as glass, plastic or silica.

11. The process of claim 8 wherein said body comprises a semiconductor doped or otherwise treated so that it comprises an electrical conductor overlaid on a semi-insulating semiconductor.

12. The process of claim 8 wherein said body comprises a film of indium tin oxide overlaying a sheet of transparent plastic.

13. The process of claim 8 wherein said lines of electric force act on said body by the process of electrolytic etching.

14. The process of claim 8 wherein said lines of electric force act on said body by the process of pulse plasma vaporization.

15. The process of claim 1 wherein said body to be fabricated is a hybrid integrated circuit.

16. The process of claim 1 wherein said body to be fabricated is a lithographic mask.

17. The process of claim 16 wherein said lithographic mask to be fabricated comprises a reticle mask.

* * * * *